(12) United States Patent
Krutsch et al.

(10) Patent No.: US 11,569,151 B2
(45) Date of Patent: Jan. 31, 2023

(54) COMPOSITE ASSEMBLY OF THREE STACKED JOINING PARTNERS

(71) Applicant: Robert Bosch GmbH, Stuttgart (DE)

(72) Inventors: Andreas Krutsch, Rottenburg (DE); Christian Schiele, Budapest (HU); Erik Sueske, Reutlingen (DE); Juergen Zipprich, Kusterdingen (DE); Thomas Suenner, Neustadt (DE)

(73) Assignee: Robert Bosch GmbH, Stuttgart (DE)

( * ) Notice: Subject to any disclaimer, the term of this patent is extended or adjusted under 35 U.S.C. 154(b) by 136 days.

(21) Appl. No.: 17/053,003

(22) PCT Filed: May 10, 2019

(86) PCT No.: PCT/EP2019/062059
§ 371 (c)(1),
(2) Date: Nov. 4, 2020

(87) PCT Pub. No.: WO2019/219533
PCT Pub. Date: Nov. 21, 2019

(65) Prior Publication Data
US 2021/0249335 A1 Aug. 12, 2021

(30) Foreign Application Priority Data
May 15, 2018 (DE) .................. 10 2018 207 537.9

(51) Int. Cl.
*H01L 23/492* (2006.01)
*B23K 1/00* (2006.01)
(Continued)

(52) U.S. Cl.
CPC ........ *H01L 23/4922* (2013.01); *B23K 1/0016* (2013.01); *H01L 21/4882* (2013.01);
(Continued)

(58) Field of Classification Search
CPC ............ H01L 23/4922; H01L 21/4882; H01L 23/367; H01L 23/3735; H01L 2224/26175;
(Continued)

(56) References Cited

U.S. PATENT DOCUMENTS

| 5,372,295 A * | 12/1994 | Abe .................. H01L 24/32 |
| | | 228/123.1 |
| 7,208,829 B2 * | 4/2007 | Hauenstein ......... H01L 23/3735 |
| | | 257/E23.012 |
| 2013/0134210 A1 * | 5/2013 | Muto ................ H01L 23/49513 |
| | | 228/256 |

FOREIGN PATENT DOCUMENTS

| DE | 10252577 A1 | 5/2004 |
| WO | 2004088725 A2 | 10/2004 |

OTHER PUBLICATIONS

International Search Report for PCT/EP2019/062059, dated Jul. 29, 2019.

* cited by examiner

*Primary Examiner* — Patricia D Valenzuela
(74) *Attorney, Agent, or Firm* — Norton Rose Fulbright US LLP; Gerard Messina

(57) ABSTRACT

A composite assembly of three stacked joining partners, and a corresponding method. The three stacked joining partners are materially bonded to one another by an upper solder layer and a lower solder layer. An upper joining partner and a lower joining partner are fixed in their height and have a specified distance from one another. The upper solder layer is fashioned from a first solder agent, having a first melt temperature, between the upper joining partner and a middle joining partner. The second solder layer is fashioned from a second solder agent, having a higher, second melt temperature, between the middle joining partner and the lower
(Continued)

joining partner. The upper joining partner has an upwardly open solder compensating opening filled with the first solder agent, from which, to fill the gap between the upper joining partner and the middle joining partner, the first solder agent subsequently flows into the gap.

10 Claims, 2 Drawing Sheets

(51) Int. Cl.
| | |
|---|---|
| *H01L 21/48* | (2006.01) |
| *H01L 23/367* | (2006.01) |
| *H01L 23/373* | (2006.01) |
| *B23K 101/40* | (2006.01) |
| *H01L 23/495* | (2006.01) |
| *H01L 23/00* | (2006.01) |

(52) U.S. Cl.
CPC ........ H01L 23/367 (2013.01); H01L 23/3735 (2013.01); *B23K 2101/40* (2018.08); *H01L 23/49513* (2013.01); *H01L 24/81* (2013.01)

(58) Field of Classification Search
CPC ....... H01L 2224/2732; H01L 2224/291; H01L 2224/29294; H01L 2224/32013; H01L 2224/33181; H01L 2224/37013; H01L 2224/40996; H01L 2224/75704; H01L 2224/75754; H01L 2224/75756; H01L 2224/83143; H01L 2224/83192; H01L 2224/83815; H01L 2224/9221; H01L 24/83; H01L 24/92; H01L 24/75; H01L 24/77; H01L 2224/293; H01L 2224/32245; H01L 2224/37011; H01L 2224/40499; H01L 2224/75703; H01L 2224/75705; H01L 2224/75755; H01L 2224/77703; H01L 2224/83191; H01L 2224/83193; H01L 2224/84815; H01L 24/33; H01L 24/37; H01L 24/40; H01L 24/84; H01L 24/32; H01L 24/81; H01L 23/49513; B23K 1/0016; B23K 2101/40
See application file for complete search history.

COMPOSITE ASSEMBLY OF THREE STACKED JOINING PARTNERS

FIELD

The present invention relates to a composite assembly of three stacked joining partners. The present invention also relates to a method for assembling a layer stack of three joining partners.

BACKGROUND INFORMATION

Components, or joining partners, in power electronics are usually thermally and electronically assembled to one another using a reflow solder process. In order to enable the production at low cost of complex structures having a plurality of components, or joining partners, and solder points, all connection points are soldered in one step. During this process, there is a volume shrinkage in the solder of approximately 50%. This causes sinking of the upper component, or joining partner, onto the lower component, or the lower joining partner. In a layer stack of three joining partners in which the upper and lower joining partners are fixed in their height, such a sinking is not possible due to the design. Due to the loss of volume during the solder process, this can result in a reduced solder bonding surface, and/or the formation of shrink holes. This can result in increased electrical and thermal resistance, and thereby reduced functionality, including reduced lifespan.

German Patent No. DE 102 52 577 B4 describes a method for producing a solder connection using capillary solder flow. The described method for bonding a first solder partner to a second solder partner includes the following steps: placement of the first solder partner, of the second solder partner, and of a solder depot in such a way that a surface of the first solder partner is situated opposite a surface of the second solder partner, and the solder depot is situated outside and adjacent to a bonding area of the opposed surfaces, such that the opposed surfaces of the solder partners in the bonding area are capable of being wetted by the solder of the solder depot, and heating of the solder partners and of the solder depot, so that the solder depot melts and is drawn into the bonding region by capillary forces in order to bond the solder partners by a bonding layer. Here, the first solder partner is a substrate and the second solder partner is a semiconductor component that is smaller than the substrate.

SUMMARY

A composite assembly of three stacked joining partners in accordance with an example embodiment of the present invention, and the method for assembling a layer stack of three joining partners in accordance with an example embodiment of the present invention, respectively may have the advantage that a loss of volume during the solder process in a layer stack of three joining partners can be compensated by suitable selection of the solder agent and the geometry of the joining partners. In this way, an adequately large bonding surface of the joining partners to one another can be ensured. The functionality of the structure with regard to electrical bonding and thermal heat dissipation is advantageously ensured over all position tolerances.

Specific embodiments of the present invention provide a composite assembly of three stacked joining partners materially bonded to one another by an upper solder layer and by a lower solder layer, an upper joining partner and a lower joining partner being fixed in their height and having a specified distance from one another. Here the upper solder layer is realized by a first solder agent, having a first melting temperature, between the upper joining partner and a middle joining partner, and the second soldering layer made of a second solder agent, having a higher second melting temperature, is fashioned between the middle joining partner and the lower joining partner. In addition, the upper joining partner has an upwardly open solder compensating opening, filled with the first solder agent, from which, in order to fill the gap between the upper joining partner and the middle joining partner, the first solder agent flows into the gap.

In addition, accordance with an example embodiment of the present invention, a method is provided for assembling a layer stack of three joining partners, an upper joining partner and a lower joining partner being fixed in their height and having a specified distance from one another. The example method includes the following steps: applying a first solder paste, whose first solder agent has a first melt temperature, to a first solderable surface of the upper joining partner and to a second solderable surface of a middle joining partner, so that a gap between the upper joining partner and the middle joining partner is filled with the first solder paste. Filling an upwardly open solder compensating opening in the first joining partner with the first solder paste. Application of a second solder paste, whose second solder agent has a higher second melt temperature, to a third solderable surface of the middle joining partner and to a fourth solderable surface of the lower joining partner, so that a gap between the middle joining partner and the lower joining partner is filled with the second solder paste. Heating of the layer stack, in a reflow solder oven, to a temperature that is higher than the second melt temperature, and subsequent cooling of the layer stack, so that during the cooling phase first the lower solder layer hardens while the upper solder layer is still molten, and a lowering occurs of the middle joining partner, and a full-surface bonding of the middle joining partner to the lower joining partner occurs, the now-larger gap between the middle joining partner and the upper joining partner being subsequently filled with the molten solder agent from the upwardly open solder compensating opening, so that, while leaving open the solder compensation opening, a full-surface bonding of the middle joining partner to the upper joining partner occurs.

As first solder agent, for example a tin-silver-copper solder (SAC) can be used. As a second solder agent, for example a tin-copper solder (SnCu) can be used that has a higher melt temperature than does the tin-silver-copper solder (SAC) and that first hardens during the cooling process.

Through the measures and developments described herein, advantageous improvements are possible of the composite assembly of three stacked joining partners in accordance with the present invention.

It is particularly advantageous that the upper solder layer can be formed, while leaving open the solder compensation opening, on a full surface between a solderable first surface of the upper joining partner and a solderable second surface of the middle joining partner. The lower solder layer can be formed as a full surface between a solderable third surface of the middle joining partner and a solderable fourth surface of the lower joining partner. Due to the full-surface material bonding of the individual joining partners to one another, an optimal electrical and thermal bond can advantageously be enabled.

In an advantageous embodiment of the composite assembly in accordance with the present invention, the upwardly open solder compensating opening can be formed above the solderable second surface of the middle joining partner and can pass through the solderable first surface. In this way, during the soldering process the first solder agent can subsequently flow directly into the gap between the upper joining partner and the middle joining partner.

In a further advantageous embodiment of the composite assembly in accordance with the present invention, the upwardly open solder compensation opening can have a volume that is at least twice as large as a volume of the gap between the upper joining partner and the middle joining partner. In this way, it can advantageously be ensured that even given a large loss of volume, an adequate quantity of first solder agent can subsequently flow into the gap between the upper joining partner and the middle joining partner.

In a further advantageous embodiment of the composite assembly in accordance with the present invention, the first joining partner can for example be a leadframe. The second joining partner can for example be a DBC (Direct Bonded Copper) substrate. The third joining partner can be for example a heat sink.

Here, a first DBC copper structure can form the second solderable surface of the second joining partner, and a second DBC copper structure can form the third solderable surface of the second joining partner. The DBC substrate can advantageously provide a very good electrical insulation and a very good thermal conductivity between the leadframe and the heat sink. In addition, the first solder layer and the second solder layer can have a significantly lower electrical resistance in comparison with a bonded connection.

Exemplary embodiments of the present invention are shown in the figures and are explained in more detail below. In the figures, identical reference characters designate components or elements that perform identical or analogous functions.

DETAILED DESCRIPTION OF EXAMPLE EMBODIMENTS

Figure 1:
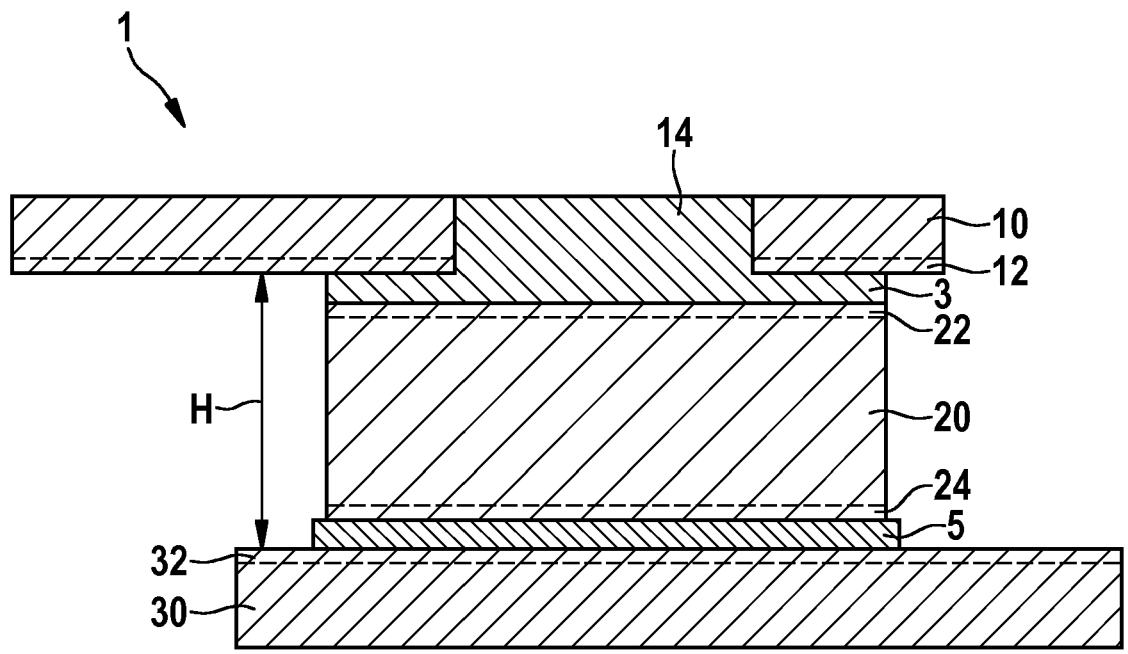
FIG. 1 shows a schematic sectional representation of a first exemplary embodiment of a composite assembly according to the present invention of three stacked joining partners, before a soldering process.

As can be seen in FIGS. 1 through 5, the depicted exemplary embodiments of a composite assembly 1, 1A of three stacked joining partners 10, 20, 30 according to the present invention each have an upper joining partner 10, a middle joining partner 20, and a lower joining partner 30, materially bonded to one another by an upper solder layer 3 and by a lower solder layer 5. Here, upper joining partner 10 and lower joining partner 30 are fixed in their height, and have a specified distance H from one another. Upper solder layer 3, of a first solder agent having a first melt temperature, is fashioned between upper joining partner 10 and middle joining partner 20. Second solder layer 5, of a second solder agent having a higher, second melt temperature, is fashioned between middle joining partner 20 and lower joining partner 30. In addition, upper joining partner 10 has an upwardly open solder compensating opening 14 filled with the first solder agent, from which, in order to fill the gap between upper joining partner 10 and middle joining partner 20, the first solder agent subsequently flows into the gap.

As is further visible in FIGS. 1 through 5, upper solder layer 3 is fashioned as a full surface, leaving open solder compensating opening 14, between a solderable first surface 12 of upper joining partner 10 and a solderable second surface 22 of middle joining partner 20. Lower solder layer 5 is fashioned as a full surface between a solderable third surface 24 of middle joining partner 20 and a solderable fourth surface 32 of lower joining partner 30.

As is also further visible from FIGS. 1 through 5, in the depicted exemplary embodiments upwardly open solder compensating opening 14 is fashioned above solderable second surface 22 of middle joining partner 20, and passes through solderable first surface 12 of upper joining partner 10. In addition, upwardly open solder compensating opening 14 has a volume that is at least twice as large as a volume of the gap between upper joining partner 10 and middle joining partner 20.

Figure 3:
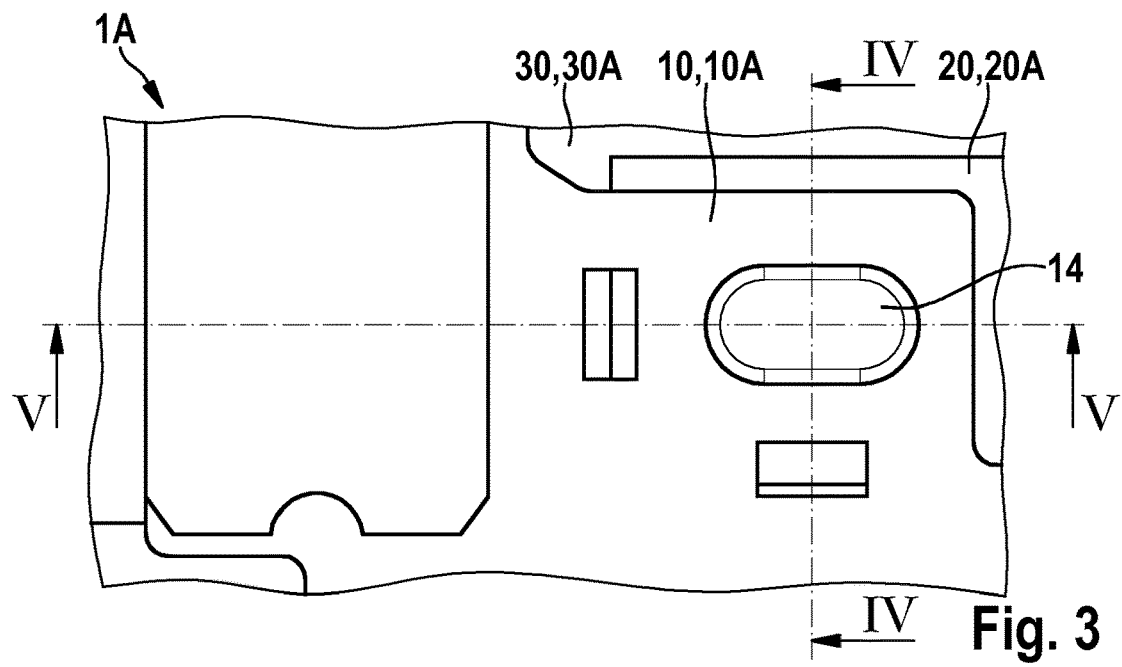
FIG. 3 shows a schematic top view of a segment of a circuit module having a second exemplary embodiment of a composite assembly of three stacked joining partners according to the present invention.
Figure 4:
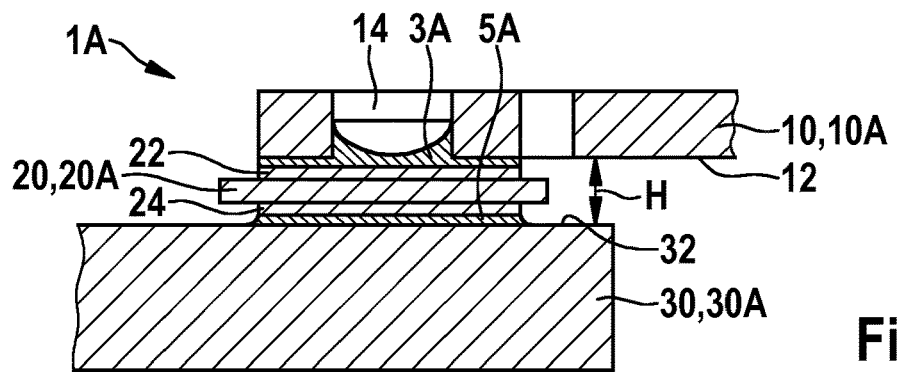
FIG. 4 shows a schematic sectional representation of the composite assembly according to the present invention of FIG. 3 along the sectional line IV-IV.
Figure 5:
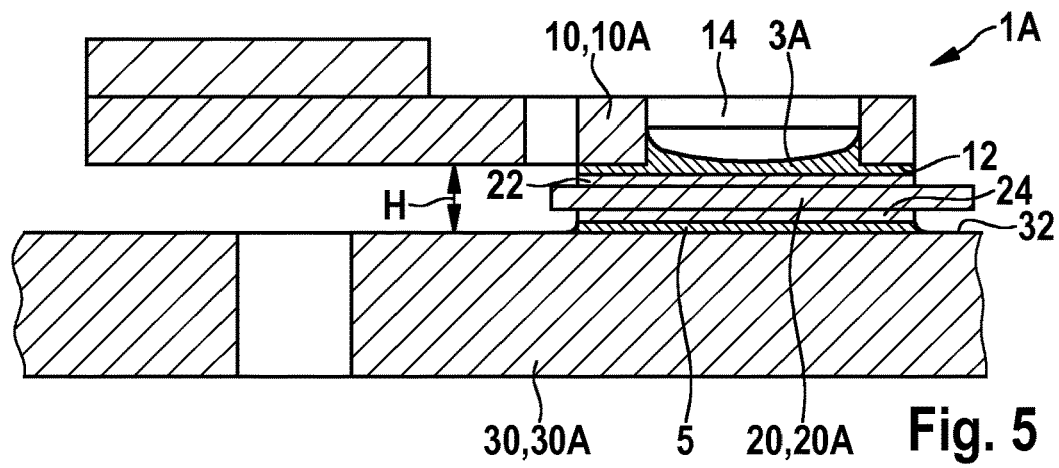
FIG. 5 shows a schematic sectional representation of the composite assembly according to the present invention of FIG. 3 along the sectional line V-V.

As is also visible in FIGS. 3 through 5, the depicted second exemplary embodiment of composite assembly LA of three joining partners 10, 20, 30 according to the present invention is part of a circuit module. Here, first joining partner 10 is a leadframe 10A, second joining partner 20 is a DBC (Direct Bonded Copper) substrate 20A, and third joining partner 30 is a heat sink 30A. In addition, a first DBC copper structure 22A forms second solderable surface 22 of second joining partner 20, and a second DBC copper structure 24A forms third solderable surface 22 of second joining partner 20.

Specific embodiments of the method according to the present invention for assembling a layer stack of three joining partners 10, 20, 30, in which an upper joining partner 10 and a lower joining partner 30 are fixed in their height and have a specified distance H from one another, include the following steps:

Applying a first solder paste, whose first solder agent has a first melt temperature, to a first solderable surface 12 of upper joining partner 10 and to a second solderable surface 22 of a middle joining partner 20, so that a gap between upper joining partner 10 and middle joining partner 20 is filled with the first solder paste. Filling an upwardly open solder compensating opening 14 in first joining partner 10 with the first solder paste. Applying a second solder paste, whose second solder agent has a higher, second melt temperature, to a third solderable surface 24 of middle joining partner 20 and to a fourth solderable surface 32 of lower joining partner 30, so that a gap between middle joining partner 20 and lower joining partner (30) is filled with the second solder paste. FIG. 1 shows the layer stack, prepared in this way, of three joining partners 10, 20, 30 before the solder process in a reflow solder oven. As can also be seen in FIG. 1, in the depicted exemplary embodiment the gap between upper joining partner 10 and middle joining partner 20, and the gap between lower joining partner 30 and middle joining partner 20, are each filled completely with the corresponding solder paste. In the depicted exemplary embodiment, the upwardly open solder compensation opening 14 in first joining partner 10 is also completely filled with the first solder paste.

In a reflow solder oven, the layer stack is heated to a temperature that is higher than the second melt temperature. Subsequently, the layer stack is cooled, so that during the cooling phase first the lower solder layer 5 hardens, while upper solder layer 3 is still molten, and there occurs a sinking of middle joining partner 20, and a full-surface bond of middle joining partner 20 to lower joining partner 30. The now-larger gap between middle joining partner 20 and upper joining partner 10 is subsequently filled with the molten solder agent from the upwardly open solder compensation opening 14, so that, while leaving open solder compensating opening 14, there occurs a full-surface bonding of middle joining partner 20 to upper joining partner 10.

Figure 2:
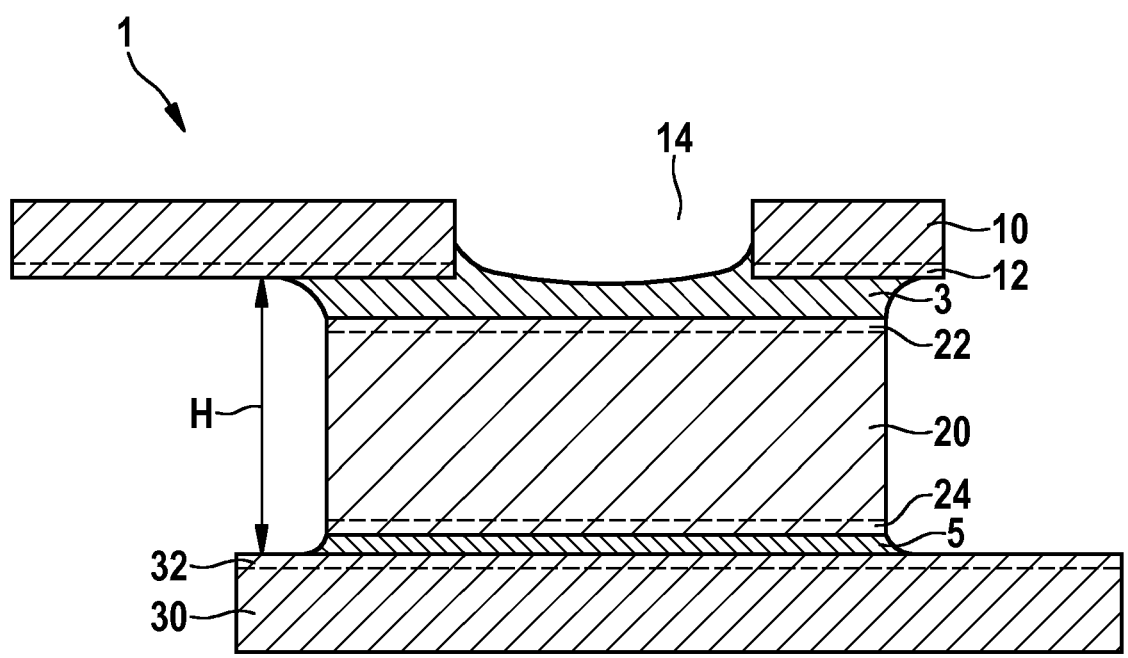
FIG. 2 shows a schematic sectional representation of the composite assembly according to the present invention of FIG. 1 after the soldering process.

FIG. 2 shows the layer stack of three joining partners 10, 20, 30 after the solder process. As can also be seen in FIG. 2, the first solder agent, brought into solder compensating opening 14 before the solder process, has almost completely flowed into the gap between upper joining partner 10 and middle joining partner 20 in order to compensate the volume loss of the first solder agent and the sinking of the middle joining partner 20 during the solder process in the reflow solder oven.

In the depicted exemplary embodiments, a tin-silver-copper solder (SAC) is used as first solder agent for upper solder layer 3. In the depicted exemplary embodiments, as second solder agent a tin-copper solder (SnCu) is used that has a higher melt temperature than does the tin-silver-copper solder (SAC) of first solder layer 3. As a result, the second solder agent of lower solder layer 5 hardens during the cooling process before the first solder agent of upper solder layer 3.

Specific embodiments of the present invention can be used for example for all power modules in inverters, and in general in molded switching modules, including with reduced power.

What is claimed is:

1. A composite assembly, comprising:
   three stacked joining partners materially bonded to one another by an upper solder layer and by a lower solder layer, an upper joining partner of the joining partners and a lower joining partner of the joining partners being fixed in their height and having a specified distance from one another, the upper solder layer is fashioned from a first solder agent having a first melt temperature, and is situated between the upper joining partner and a middle joining partner of the joining partners, and the lower solder layer is fashioned from a second solder agent, having a higher, second melt temperature relative to the first melt temperature, and is situated between the middle joining partner and the lower joining partner, wherein the upper joining partner has an upwardly open solder compensating opening filled with the first solder agent, from which, in order to fill a gap between the upper joining partner and the middle joining partner, the first solder agent subsequently flows into the gap.

2. The composite assembly as recited in claim 1, wherein the upper solder layer is fashioned as a full surface, leaving open the solder compensating opening, between a solderable first surface of the upper joining partner and a solderable second surface of the middle joining partner.

3. The composite assembly as recited in claim 1, wherein the lower solder layer is fashioned as a full surface between a solderable third surface of the middle joining partner and a solderable fourth surface of the lower joining partner.

4. The composite assembly as recited in claim 2, wherein the upwardly open solder compensating opening is situated above the solderable second surface of the middle joining partner and passes through the solderable first surface.

5. The composite assembly as recited in claim 1, wherein the upwardly open solder compensating opening has a volume that is at least twice as large as a volume of the gap between the upper joining partner and the middle joining partner.

6. The composite assembly as recited in claim 1, wherein the first upper joining partner is a leadframe.

7. The composite assembly as recited in claim 1, wherein the middle joining partner is a DBC substrate.

8. The composite assembly as recited in claim 7, wherein a first DBC copper structure forms a second solderable surface of the middle joining partner, and a second DBC copper structure forms a third solderable surface of the middle joining partner.

9. The composite assembly as recited in claim 1, wherein the lower joining partner is a heat sink.

10. A method for assembling a layer stack of three joining partners, an upper joining partner of the joining partners and a lower joining partner of the joining partners being fixed in their height and having a specified distance from one another, the method comprising the following steps:
    applying a first solder paste, whose first solder agent has a first melt temperature, to a first solderable surface of the upper joining partner and to a second solderable surface of a middle joining partner of the joining partners, so that a gap between the upper joining partner and the middle joining partner is filled with the first solder paste;
    filling an upwardly open solder compensating opening in the upper joining partner with the first solder paste;
    applying a second solder paste, whose second solder agent has a higher, second melt temperature relative to the first melt temperature, to a third solderable surface of the middle joining partner and to a fourth solderable surface of the lower joining partner, so that a gap between the middle joining partner and the lower joining partner is filled with the second solder paste;
    heating the layer stack, in a reflow solder oven, to a temperature that is higher than the second melt temperature; and
    subsequent to the heating, cooling the layer stack, so that during the cooling, first the lower solder layer hardens while the upper solder layer is still molten, and a sinking of the middle joining partner occurs and a full-surface bonding of the middle joining partner to the lower joining partner, a now-larger gap between the middle joining partner and the upper joining partner being subsequently filled with molten solder agent from the upwardly open solder compensating opening, so that, while leaving open the solder compensating opening, there occurs a full-surface bonding of the middle joining partner to the upper joining partner.

* * * * *